United States Patent

Ellis

[11] Patent Number: 6,156,990
[45] Date of Patent: Dec. 5, 2000

[54] LONG-WEARING IMPERVIOUS CONDUCTIVE WIRE CLAMP

[75] Inventor: Timothy W. Ellis, Doylestown, Pa.

[73] Assignee: Kulicke & Soffa Industries, Inc., Willow Grove, Pa.

[21] Appl. No.: 09/102,289

[22] Filed: Jun. 22, 1998

[51] Int. Cl.⁷ .................................................. B23K 37/00
[52] U.S. Cl. ........................ 219/56.21; 219/56.1; 228/4.5
[58] Field of Search ................... 219/56.1, 56.21, 219/56.22; 228/4.5; 269/273, 286

[56] References Cited

U.S. PATENT DOCUMENTS 3,971,499  7/1976  Goodrich, Jr. et al. .................. 228/54
3,986,653 10/1976  Gilding ................................ 228/4.5 X
5,628,922  5/1997  Chen .................................... 219/56.21

FOREIGN PATENT DOCUMENTS 57-159034 10/1982 Japan .

*Primary Examiner*—Gregory Mills
*Attorney, Agent, or Firm*—Synnestvedt & Lechner LLP

[57] ABSTRACT

A wire bonding machine having a wire clamp comprised of a platinum group metal such as iridium, rhodium, ruthenium, or osmium so as to minimize corrosion due to micro sparking.

45 Claims, 5 Drawing Sheets

LONG-WEARING IMPERVIOUS CONDUCTIVE WIRE CLAMP

FIELD OF THE INVENTION

The invention pertains to wire clamps. The invention particularly pertains to wire clamps in wire bonding machines.

BACKGROUND OF THE INVENTION

One of the many steps involved in the fabrication of integrated circuit packages is wire bonding of the semiconductor die contact pads to the lead frame or chip carrier package. Particularly, once a semiconductor die has been fully fabricated and diced from the wafer, it is mounted onto a lead frame or chip carrier package. At this point, the contact pads on the surface of the die must be electrically coupled to the pins of the lead frame so that signals may pass to and from the die to external circuitry through the pins on the lead frame. The pins will protrude from the final molded integrated circuit package within which the die will ultimately be encased during fabrication. Generally, each contact pad is electrically coupled to one pin on the lead frame by means of wire bonding.

Wire bonding machines electrically connect the contact pads on the die to the electrical paths (i.e., pins) on the lead frame by placing a jumper wire which runs from the contact pad on the die surface to the conductive path on the lead frame. One widely used method of wiring bonding utilizes gold wire for the jumper wires.

In such wire bonding machines, a wire delivery system is provided. In one particular design, several hundred feet of continuous, wound gold wire is provided on a spool which is mounted on a spool holder on the wire bonding machine. The wire is run from the spool over a tensioner, through a wire clamp and into a capillary head. The clamp is in a fixed relation to the capillary head such that, when the clamp is closed (i.e., clamped), the wire is in fixed relation to the capillary head and, when the clamp is open, the wire may move through the capillary head.

In a modern, fully automated, wire bonding machine, lead frames with dies mounted thereon are (hereinafter lead frame/die units) run through wire bonding machines at a rate typically in the range of 1–20 lead frame/die units per minute depending on the number of bonds per unit. When a lead frame/die unit moves into position for wire bonding, a pattern recognition system locates the exact position of the die and lead frame. The capillary head is then positioned over the first contact pad of the die with the end of the gold wire at the tip of the capillary head. An electric flame off probe is positioned near the end of the wire protruding from the tip of the capillary head and applies an electric pulse or arc, termed an electric flame-off pulse, to the wire causing the end of the wire to melt into a ball. This electrical pulse typically may be on the order of approximately 5000 volts at approximately 10 milli-amps. As will be explained in greater detail below, the electric flame off pulse is grounded through the wire. Surface tension effects cause the melted wire to form into a ball. The ball is allowed to cool for a moment and solidify. The bond head then moves into position over the next pad to be bonded. With the wire clamp open, the capillary is then accelerated downward. The clamp closes en route to hold the gold ball protruding from the capillary head in place at the recess in the capillary tip. Finally, the capillary comes into contact with a contact pad on the die, at which time the clamp opens. The machine then bonds the ball to the contact pad by thermo-sonic bonding, i.e., applying ultrasonic energy at a temperature above ambient, for example 200° Celsius.

The wire clamp, is open during the welding operation and remains open while the capillary head moves up trailing the wire out of its end. The head is moved upwards a distance sufficient to cause an amount of wire to trail out of the end of the capillary that can reach from the contact pad to the appropriate point on the lead frame to which that contact pad is to be electrically coupled via the gold wire. The clamp then closes and the capillary head moves to the point over the lead frame where the other end of the jumper wire is to be bonded. The capillary head is accelerated downward to cause the gold wire to contact the appropriate point on the lead frame. The wire is then thermo-sonically welded to the lead frame in the same manner as described above with respect to bonding to the die contact pad.

The clamp opens and the capillary head moves upwards trailing more wire. The clamp then closes and the head is moved up further to snap the wire at the second bond fracture point leaving a "tail" of wire protruding from the capillary. The tail wire will be formed into the next ball when the next electric flame off pulse or arc is applied. The capillary head then moves to a position above the next contact pad on the die and the above described process is repeated for each contact pad that is to be wire bonded to a pin on the lead frame. A modern wire bonding machine typically may be capable of making about 4–20 wire bonds per second on a die/lead frame unit.

In a fully automated fabrication facility, thousands of dies can be run in a single day comprising tens of thousands of wire bonds. It can be seen that wire bonding machines are an integral part of a semiconductor fabrication line and that failure of such equipment could potentially hold up an entire fabrication line. Accordingly, it is desirable to minimize breakdown and wear of wire bonding machines.

As mentioned above, the high voltage electric flame off pulse which melts the gold wire into a ball is grounded through the gold wire itself in the wire bonding machine. However, it is undesirable to allow the current pulses to run all the way through the wire into the spool because the current pulses running through the large number of turns in the wire wrapped around the spool would create a large, pulsing magnetic field due to induction effects. Such a magnetic field could have significant adverse effect on other electrical components in the area, including the electrical components of the wire bonding machine itself and the integrated circuits that are being fabricated. Accordingly, in many wire bonding machines, the current pulse is grounded from the wire through the wire clamp to ground so that the current does not run through the wire that is still on the spool.

Many wire bonding machines also have monitoring systems used to constantly determine whether the wire has broken at an unexpected time or in an unexpected place. Such systems commonly run a very low current from the tip of the capillary through the wire and the clamp to ground. A current sensor monitors the current between the clamp and ground. When the wire is not broken between the clamp and the capillary tip, the detection system will detect current. However, if the wire breaks between the capillary tip and the clamp, the current will stop flowing, thus tripping a warning system which will stop the machine.

Thus, two of the primary functions of the clamp are 1) to clamp the wire at programmed times, and 2) to provide a current path to ground through the wire. Consequently, two of the requirements for the material at the face of the clamp that contacts the wire are that 1) it should be hard and smooth so as to clamp and hold the wire securely without damaging it, and 2) it should be highly conductive.

One typical type of wire clamp comprises two clamp halves which close and open to clamp and unclamp the wire. One of the clamp halves is comprised of a hard and smooth, but not conductive, material such as sapphire or aluminum oxide ($AlO_2$) The other clamp half commonly may be comprised of a cemented carbide material, such as tungsten carbide cemented with cobalt (WC/Co), titanium carbide cemented with nickel (TiC/Ni) or titanium carbide cemented with cobalt (TiC/Co). In particular, taking WC/Co as an example, the clamp half is comprised of tungsten carbide grains cemented together with a transition metal such as cobalt. The cementing component might also comprise nickel, either alone or in combination with cobalt. The overall metallurgic alloy typically might be approximately 93% WC and 7% Co. The metallurgical composition also may have some other small trace compounds such as titanium.

When the electric flame-off (EFO) pulse occurs and the current runs through the wire and clamp to ground, micro sparking occurs at the wire/clamp interface. Particularly, at the microscopic level, the surface of the WC/Co clamp is rough because it is comprised of WC granules bonded together by Co. Accordingly, at the microscopic level, sparks jump through the air from the wire to the WC/Co. Because WC has a resistivity substantially higher than that of Co, most of the current travels through the Co binder material in the clamp half. The micro sparking causes cobalt oxides to form on the surface of the clamp half. Cobalt oxides are not particularly conductive. The formation of the cobalt oxides on the surface causes current to be concentrated elsewhere where less cobalt oxide has formed. This causes increased micro sparking in those areas, thus even further increasing the rate of production of cobalt oxide. Accordingly, as cobalt oxide builds up, the problem compounds itself.

This corrosion of the cobalt further leads to failure of the WC/Co material because cobalt oxide is chalky, hydroscopic and wears off quickly, causing the WC granules to fall off. Accordingly, the micro sparking and related problems of cobalt oxide formation and material failure leads to two significant problems. First, the conductivity of the clamp decreases, leading to decreased efficiency in dumping the current from the EFO. It also leads to increased occurrence of false detections of wire breaks because of substantially diminished current flow due to the high resistivity of the clamp. Secondly, the problem of the WC grains falling off causes the clamp surface to become rough and to nick the wire, thus leading to wire breakage.

Even further, cobalt can alloy with gold to form a brittle, hard, material with low adhesion and with a coefficient of expansion that is large compared to cobalt. Accordingly, formation of a cobalt/gold alloy on the surface of the clamp is possible and the different coefficients of expansion could cause the clamp surface to crack.

Due to these various corrosion problems, conventional clamps require frequent cleaning, typically are one of the highest wear components of a wire bonding machine, and require frequent replacement.

Accordingly, it is an object of the present invention to provide an improved wire bonding machine.

It is another object of the present invention to provide an improved clamp for a wire bonding machine.

It is a further object of the present invention to provide a clamp comprised of a highly conductive, hard, smooth material that will minimize corrosion due to the wire bonding operation.

It is yet a further object of the present invention to provide a clamp for a wire bonding machine comprised of a material which overcomes the aforementioned problems of the prior art.

SUMMARY OF THE INVENTION

In accordance with the present invention, at least a portion of a clamp for clamping the wire in a wire bonding machine is comprised of a hard platinum group element such as iridium, rhodium, ruthenium, or osmium. Clamps made of one of these materials display greatly enhanced erosion/corrosion resistance. These elements are extremely hard, can be polished to great smoothness, are highly conductive and do not erode or corrode significantly. Further, none of these platinum group metals forms an alloy with gold. Also, they do not form oxides, carbides, nitrides, or sulfides, which tend to be brittle and have low conductivity. Further, to the extent that any of these metals would form oxides, such oxides are not stable at high temperature. Therefore, any oxides would revert back to the original metal and oxygen very quickly. Accordingly, a clamp comprised of such a material essentially would not erode or corrode.

DETAILED DESCRIPTION OF PREFERRED EMBODIMENTS OF THE INVENTION

Figure 1:
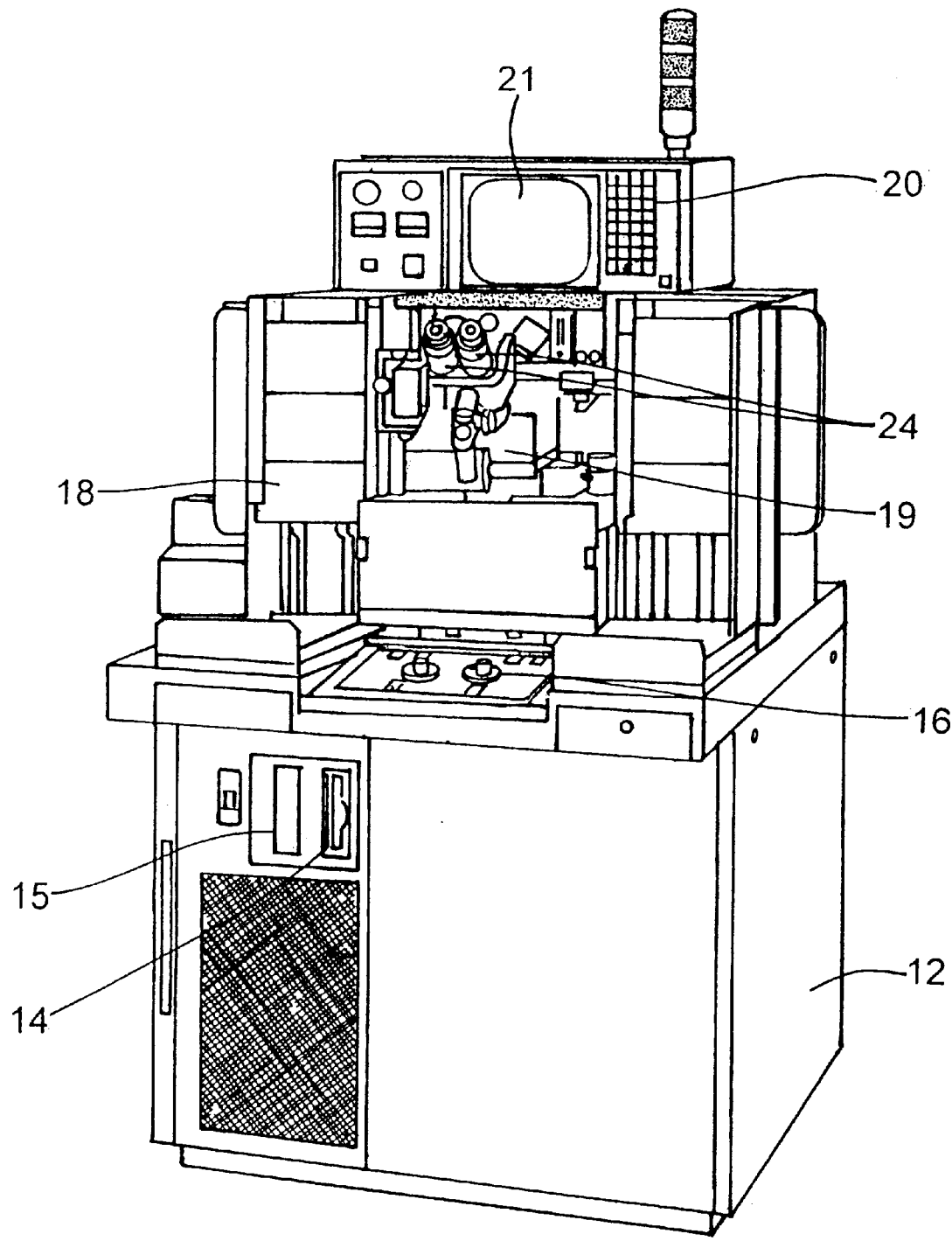
FIG. 1 is a perspective view of a wire bonding machine in accordance with the present invention.

FIG. 1 shows an exemplary wire bonding machine 10 in accordance with the present invention. The unit 10 includes a base housing 12. Enclosed within base housing 12 is a substantial amount of electronics, including a floppy drive 14, a hard disk drive 15 and a processor (not shown). The automated work table on which a die/lead frame unit is wire bonded is shown at 16. An input elevator 18 can be manually or automatically loaded with magazines containing die/lead frame units. In the exemplary, fully automated, machine, magazines are individually lowered and conveyed onto the work table 16. A pattern recognition system embodied within sub-housing 20 includes a camera and related software and hardware to locate the exact position of each die and lead frame unit. An operator of the machine may obtain a magnified view of the die/lead frame unit either by viewing it on monitoring unit 21 or by looking through eye pieces 24. Eye pieces 24 are part of a magnification system which allows an operator to view a magnified image of the die which is in the work position on table 16. A wire spool pin (not shown because hidden behind the optical assembly) is provided for mounting a spool of gold wire for use in the wire bonding operation.

The camera embodied within the housing 20 is hooked up to video equipment which allows the image obtained by the camera to be viewed on the CRT screen in monitoring unit 21. In FIG. 1, the bond head has been removed from the machine in order not to obfuscate the other components of the unit. The bond head normally would be positioned at 19 just beneath the pattern recognition sub-housing 20.

Figure 2:
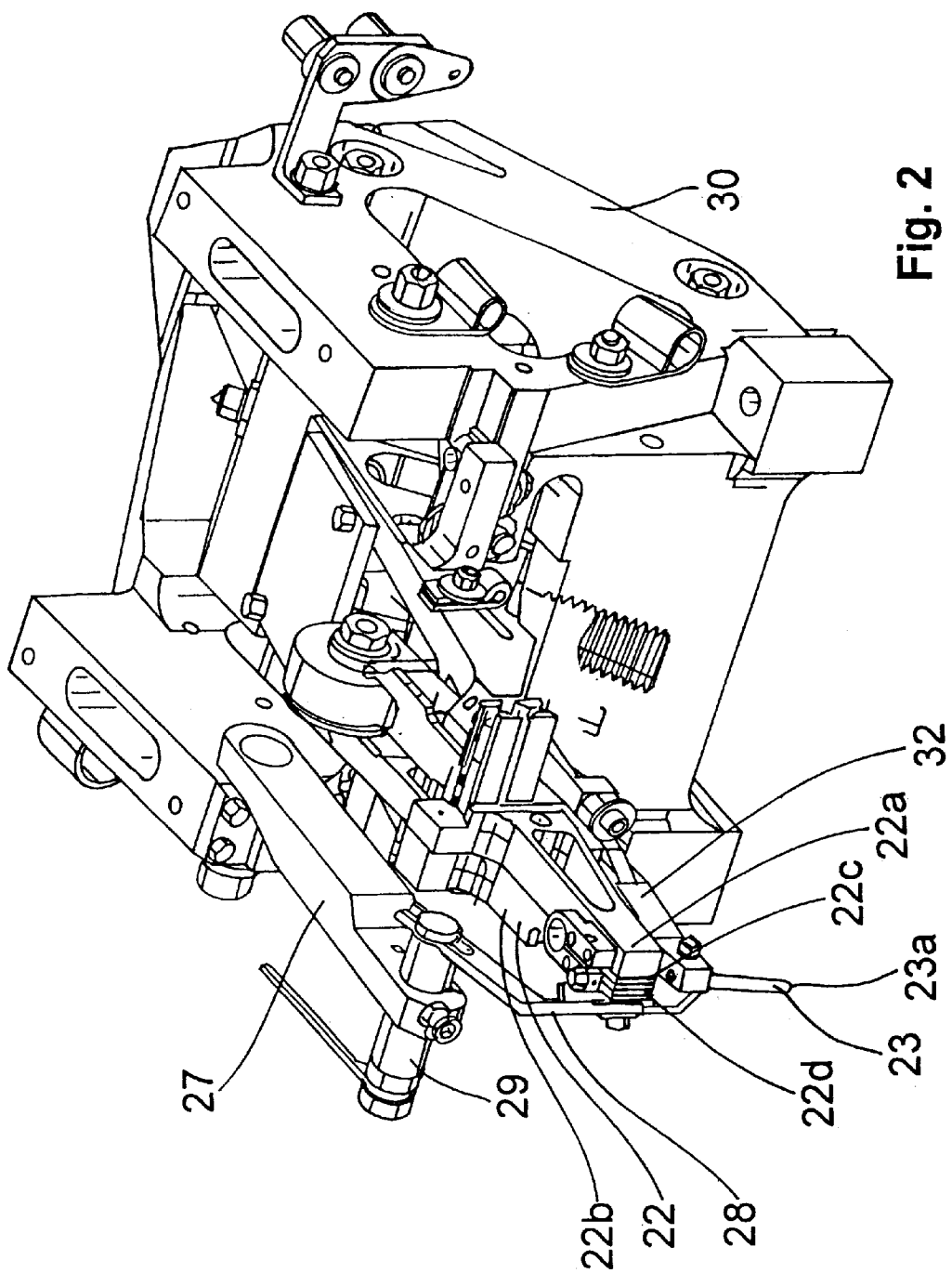
FIG. 2 is a perspective view of the head assembly, including the clamp, of a wire bonding machine in accordance with the present invention.
Figure 3:
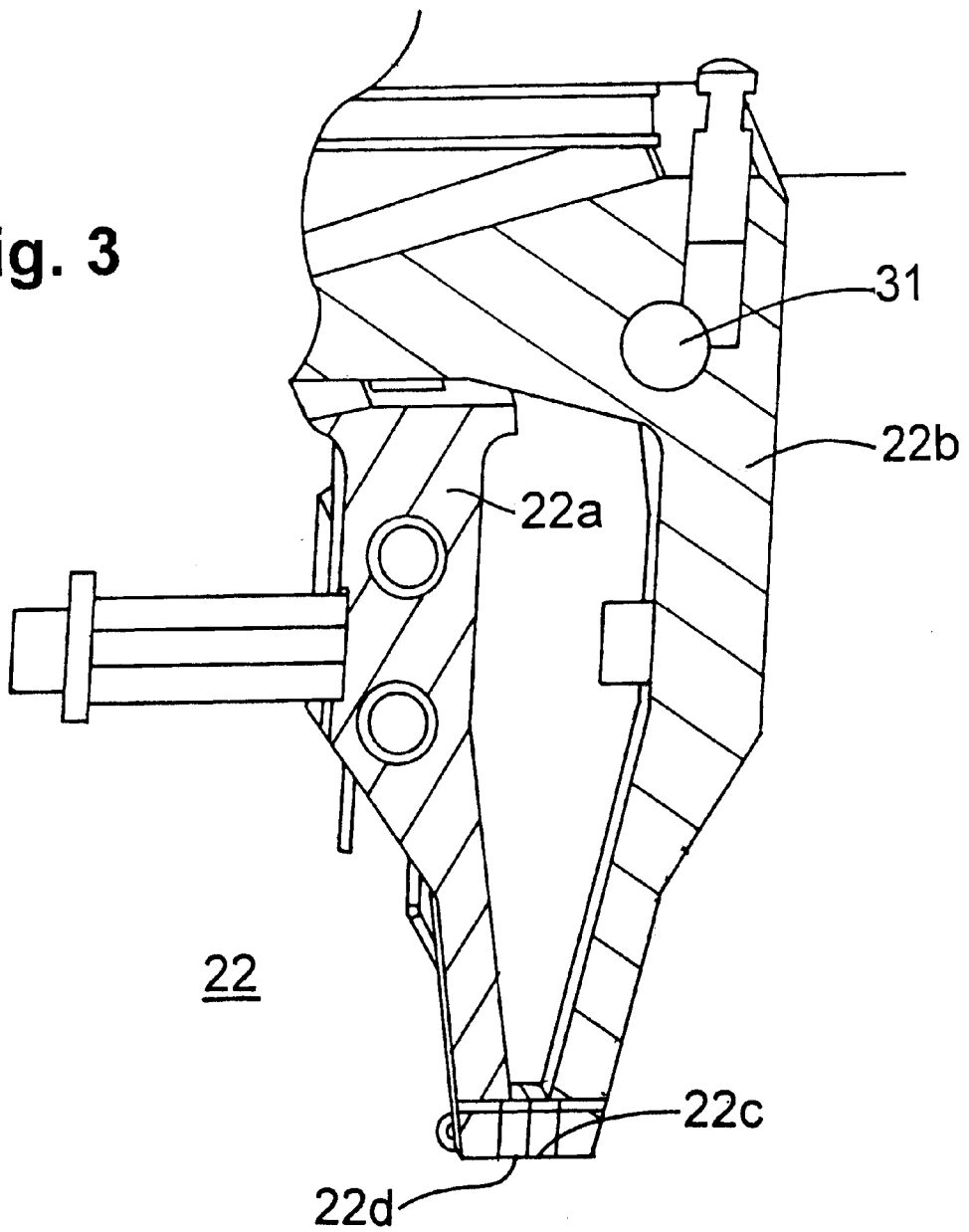
FIG. 3 is a perspective view of the clamp half in accordance with the present invention.

FIG. 2 is a perspective view of an exemplary bond head in accordance with the present invention. FIG. 3 is a more detailed, close-up perspective view of the wire clamp portion of the bond head. In the following description of the device of the present invention reference should be made to both FIGS. 2 and 3. The bond head is comprised of a frame member 30 which is designed to provide means for mounting the bond head on a movable carriage assembly of the bonding machine 10 as well as to provide mounting positions for all of the components needed for wire bonding operations, such as the clamp, the capillary head, and the electric flame-off probe. The clamp is shown at 22 and comprises two clamp halves 22a and 22b. The clamp is mounted on the movable portion of the bond head termed the link 25. The link 25 is vertically pivotable about axis 25a to orient the capillary appropriately for the given application. Clamp half 22a is fixedly mounted to the link 25. The movable clamp half 22b is pivotable about vertical axis 31 to open and close the clamp 22.

An ultrasonic transducer 32 is mounted to the link just below the clamp. The capillary head 23 is mounted in the transducer 32.

A capillary head 23 is positioned directly below the clamp 22. An electric flame off (EFO) probe 26 is positioned adjacent the capillary head 23 via arms 27 and 28 and slidable member 29. All of members 27, 28, and 29 are adjustable on frame 30 such that the EFO probe 26 can be positioned precisely with respect to capillary head 23.

In operation, the gold wire which will be used in the wire bonding operations will pass in between clamp halves 22a and 22b into and through the hole 23a in capillary head 23. The bond head assembly 20 is mounted on a shaft end carriage assembly so that it is movable three dimensionally.

Clamp half 22a is constructed primarily in accordance with the prior art. Half 22a is the fixed clamp half as is constructed of aluminum oxide with a sapphire jewel facing 22d at the wire contact surface (see FIG. 3). In accordance with the present invention, at least a portion of a clamp for clamping the wire relative to the capillary head in a wire bonding machine is comprised of a hard platinum group element such as iridium, rhodium, ruthenium, or osmium. Elements from this periodic table group, namely group VIIIA (CRC Handbook of Chemistry and Physics, 71st Ed., CRC Press, Inc.) have characteristics that make them highly suited for use as wire clamp material in a wire bonding machine. Particularly, they are very hard and can be polished very smooth. Accordingly, they can clamp the wire tightly without damaging the wire. Further, each is highly conductive so that the clamp can be used as part of a conductive path for grounding the electric flame off pulse as well as a current that may be used for monitoring wire continuity. Most importantly, each of these elements is highly resistant to the corrosion and erosion problems discussed above with respect to prior art clamps formed of cemented carbides. Thus, use of any of these elements or alloys of them to form the wire clamp in a wire bonding machine substantially prolongs clamp life.

Moreover, none of these platinum group metals alloy with gold. Also, they do not form oxides, carbides, nitrides, or sulfides which tend to be brittle and have low conductivity. Further, to the extent that any of these metals might form oxides, such oxides are not stable at high temperature. Therefore, any such oxides would revert back to the original metal and oxygen very quickly. Accordingly, a clamp comprised of such a material essentially would not erode or corrode.

The platinum group elements tend to be very expensive materials. Accordingly, while the entire clamp can be formed of the selected platinum group element, essentially all of the benefits to be gained from use of these materials can be achieved simply by providing a thin layer of the selected material on the surface of the clamp that contacts the wire. Further, only one of the clamp halves (jaws) need be formed of or coated with the selected platinum group material. The other clamp half may be formed of aluminum or any other material commonly used in the prior art since there is no requirement that the electric flame off current pulses have a path to ground through both clamp halves.

Specifically, the corrosion caused by micro-sparking is a surface phenomenon. Accordingly, this problem with the prior art is solved in a clamp in which the clamp surface that contacts the wire is formed of a hard platinum group metal. Since these metals tend to be very expensive, in a preferred embodiment of the invention, only the clamp surface that contacts the wire is coated with the hard platinum group metal 22d (see particularly FIG. 3). The body 22b of the clamp half is constructed of a more economical, conductive, material such as aluminum or magnesium or a piezo-electric jewel.

Of the platinum group metals, iridium is relatively inexpensive and readily available as sheets. Accordingly, in accordance with at least one preferred embodiment of the invention, the clamp body 22b is comprised of aluminum with the clamp wire contact face bearing an iridium layer 22d adhered or diffusion bonded thereto.

In order to assure reliable bonding such that the sheet will not peel off, the sheet should be at least 1 micron in thickness. In a preferred embodiment of the invention, the sheet is about 2 microns thick.

The wire contact surface may be coated with the platinum group metal by any other reasonable means, including sputter deposition, and electro-plating. If coating by sputter deposition, a layer at least about 0.5 microns thick should be sufficient.

Figure 4:
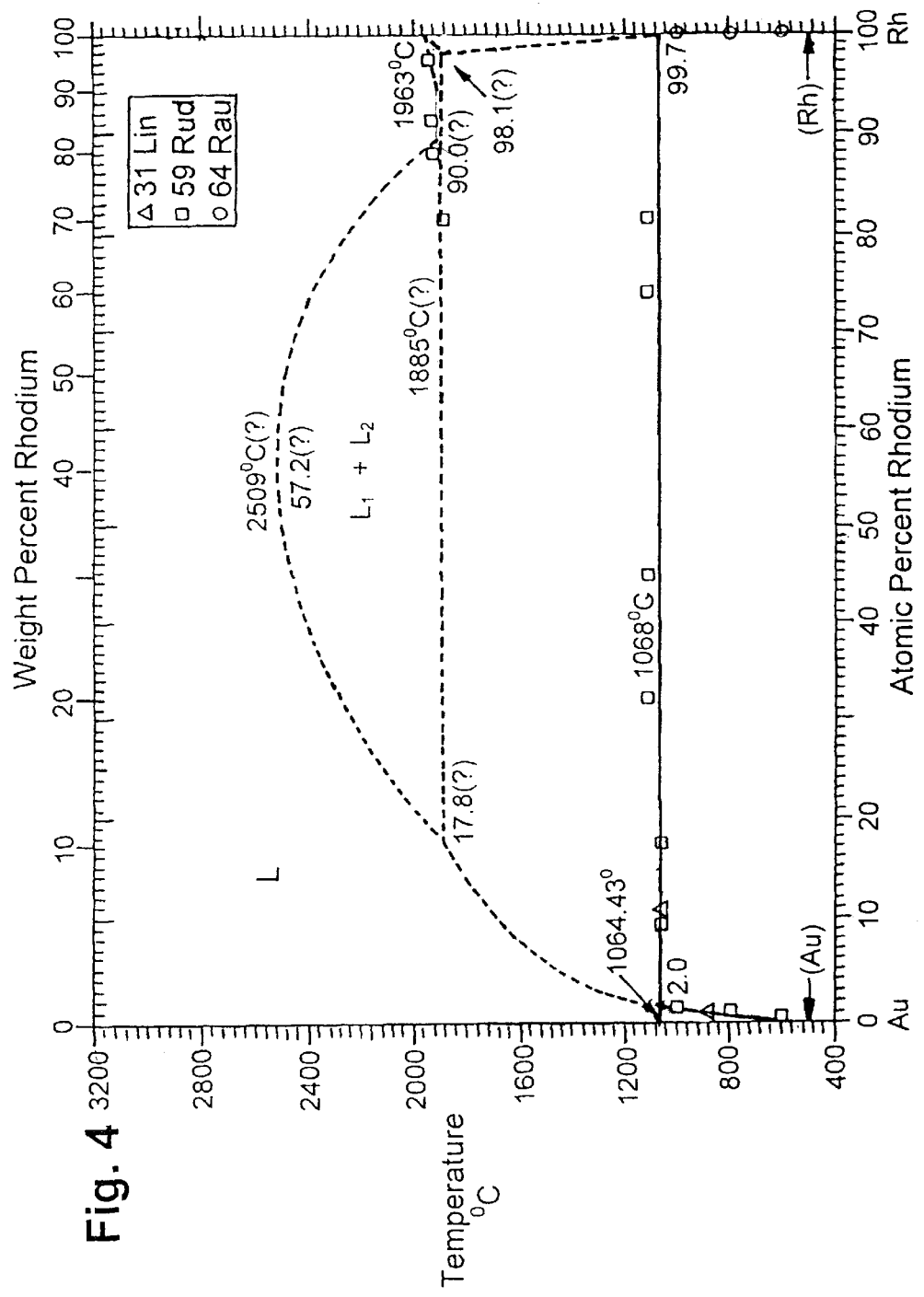
FIG. 4 is a phase diagram of a gold-rhodium alloy system.
Figure 5:
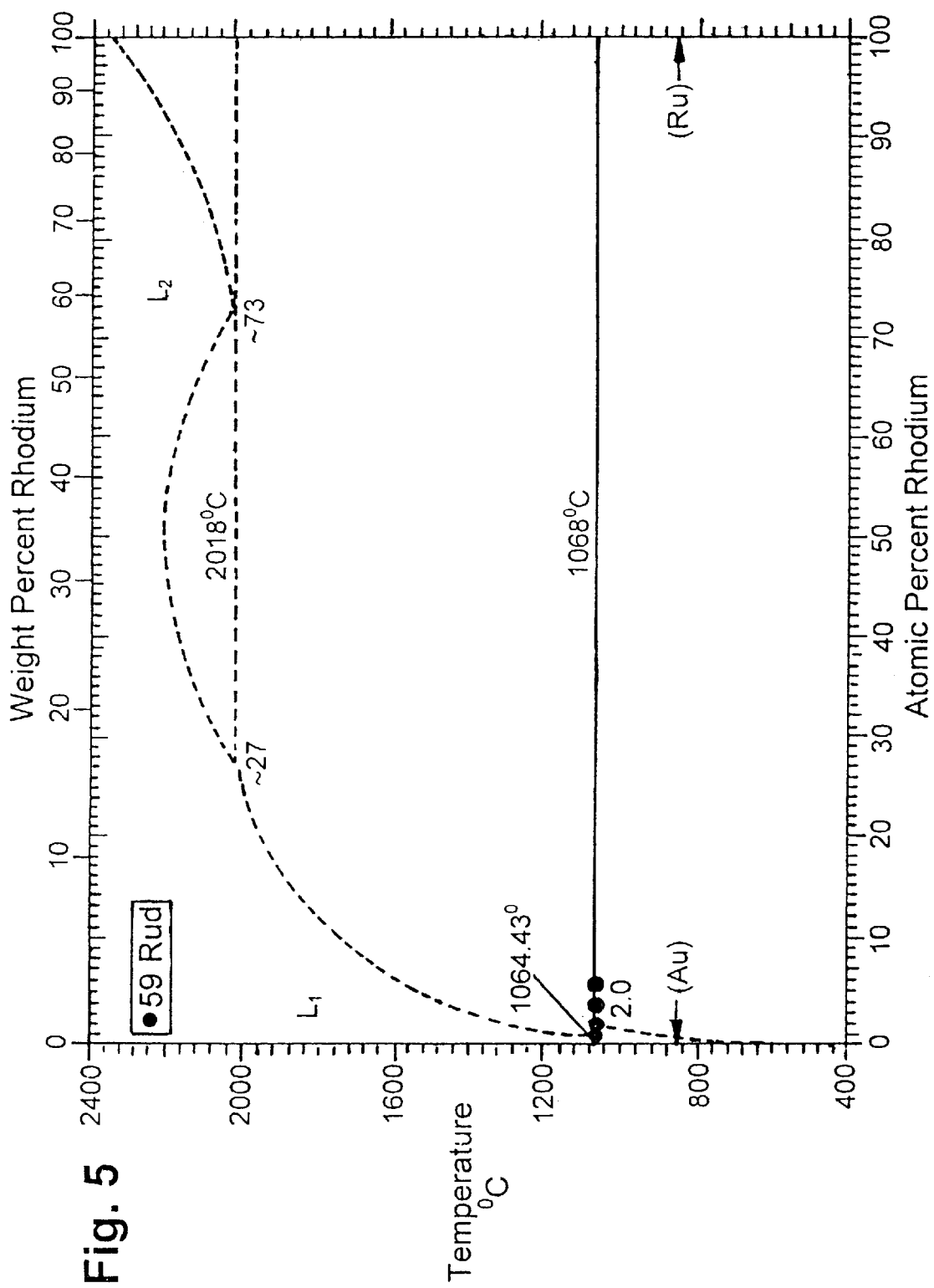
FIG. 5 is a phase diagram of a gold-ruthenium alloy system.

FIGS. 4 and 5 are phase diagrams for gold/rhodium and gold/ruthenium systems, respectively. As can be seen, gold generally will not alloy with these elements and, to the extent that it does, the solubility of Group VIII A elements in gold decreases and temperature decreases.

Having thus described a few particular embodiments of the invention, various alterations, modifications, and improvements will readily occur to those skilled in the art. Such alterations, modifications and improvements as are made obvious by this disclosure are intended to be part of this description though not expressly stated herein, and are intended to be within the spirit and scope of the invention. The foregoing description is by way of example only, and not limiting. The invention is limited only as defined in the following claims and equivalents thereto.

What is claimed:

1. A wire clamp for wire bonding machine comprised of the material selected from the hard platinum-group elements.

2. A wire clamp as set forth in claim 1 wherein said material comprises iridium.

3. A wire clamp as set forth in claim 1 wherein said material comprises rhodium.

4. A wire clamp as set forth in claim 1 wherein said material comprises ruthenium.

5. A wire clamp as set forth in claim 1 wherein said material comprises an alloy of hard platinum elements.

6. A wire clamp as set forth in claim 1 wherein said material comprises osmium.

7. A wire clamp as set forth in any of claims 1 and 2 wherein said wire clamp is comprised of a second material that is covered by said hard platinum element.

8. A wire clamp as set forth in claim 7 wherein said second material is aluminum.

9. A wire clamp as set forth in claim 7 wherein said second material is magnesium.

10. A wire clamp as set forth in claim 7 wherein said second material is a piezo-electric jewel.

11. A wire clamp as set forth in claim 7 wherein said hard platinum element is formed as a surface layer on said second material.

12. A wire clamp as set forth in claim 11 wherein said hard platinum element is sputter deposited on said second material.

13. A wire clamp as set forth in claim 12 wherein said layer is at least about 0.5 microns thick.

14. A wire clamp as set forth in claim 11 wherein said hard platinum element is electroplated on said second material.

15. A wire clamp as set forth in claim 14 wherein said layer is at least about 1.0 micron thick.

16. A wire clamp as set forth in claim 15 wherein said layer is about 2 microns thick.

17. A wire clamp as set forth in claim 11 wherein said hard platinum material is formed as a layer on said portion of said clamp that contacts said wire during operation of said wire bonding machine.

18. A wire clamp as set forth in claim 7 wherein said layer is a sheet of said hard platinum element bonded to a surface of said second material.

19. A wire clamp as set forth in claim 18 wherein said layer is at least about 1.0 micron thick.

20. A wire clamp as set forth in claim 18 wherein said layer is about 2 microns thick.

21. A wire clamp as set forth in claim 7 wherein said wire clamp is comprised of first and second jaws and wherein said first jaw is comprised of said second material that is covered by said hard platinum element and said second jaw is comprised of aluminum.

22. A wire clamp as set forth in any of claims 1 and 2 wherein said wire is comprised of gold.

23. A wire bonding machine comprising:
   a bond head having a capillary for bonding wire to said semiconductor die and lead frame combination unit;
   a clamp for clamping and unclamping said wire so as to alternately maintain said wire in a fixed position relative to said capillary head and allow said wire to move relative to said capillary head, respectively;
   a wire delivery system for delivering wire to said capillary head through said clamp; and
   an automated control system for operating said machine to bond wire to said semiconductor die and lead frame combination unit;
   wherein said clamp is comprised of a hard platinum-group element.

24. A wire bonding machine as set forth in claim 23 wherein said machine further comprises:
   an electric flame off head for applying an electric pulse to said wire to melt an end of said wire into a ball;
   wherein said clamp is coupled to electrical ground; and
   wherein said electric pulse is grounded through said wire and said clamp.

25. A wire bonding machine as set forth in claim 24 wherein said clamp comprises iridium.

26. A wire bonding machine as set forth in claim 23 wherein said clamp comprises rhodium.

27. A wire bonding machine as set forth in claim 23 wherein said clamp comprises ruthenium.

28. A wire bonding machine as set forth in claim 23 wherein said clamp comprises an alloy of hard platinum elements.

29. A wire bonding machine as set forth in claim 23 wherein said clamp comprises osmium.

30. A wire bonding machine as set forth in claim 23 wherein said wire clamp is comprised of a second material that is covered by said hard platinum element.

31. A wire bonding machine as set forth in claim 30 wherein said second material is aluminum.

32. A wire bonding machine as set forth in claim 30 wherein said second material is magnesium.

33. A wire bonding machine as set forth in claim 30 wherein said second material is a piezo-electric jewel.

34. A wire bonding machine as set forth in claim 30 wherein said hard platinum element is formed as a surface layer on said second material.

35. A wire bonding machine as set forth in claim 34 wherein said layer is a sheet of said hard platinum element bonded to a surface of said second material.

36. A wire bonding machine as set forth in claim 35 wherein said layer is at least about 1.0 micron thick.

37. A wire bonding machine as set forth in claim 36 wherein said layer is about 2 microns thick.

38. A wire bonding machine as set forth in claim 37 wherein said hard platinum element is sputter deposited on said second material.

39. A wire bonding machine as set forth in claim 38 wherein said layer is at least about 0.5 microns thick.

40. A wire bonding machine as set forth in claim 37 wherein said hard platinum element is electroplated on said second material.

41. A wire bonding machine as set forth in claim 40 wherein said layer is at least about 1.0 micron thick.

42. A wire bonding machine as set forth in claim 41 wherein said layer is about 2 microns thick.

43. A wire bonding machine as set forth in claim 30 wherein said hard platinum material is formed as a layer on said portion of said clamp that contacts said wire during operation of said wire bonding machine.

44. A wire bonding machine as set forth in claim 43 wherein said wire is comprised of gold.

45. A wire bonding machine as set forth in claim 30 wherein said wire clamp is comprised of first and second jaws and wherein said first jaw is comprised of said second material that is covered by said hard platinum element and said second jaw is comprised of aluminum.

* * * * *